United States Patent
Azizian et al.

(10) Patent No.: US 11,778,722 B2
(45) Date of Patent: Oct. 3, 2023

(54) AUTONOMOUS VEHICLE COMPUTING DEVICE WITH BARRIER LAYER

(71) Applicant: GM Cruise Holdings LLC, San Francisco, CA (US)

(72) Inventors: Reza Azizian, San Jose, CA (US); Jameson Tai, San Francisco, CA (US); Brian Schlotterbeck, San Francisco, CA (US); Yung Chang Ko, San Francisco, CA (US); Srinivasa Rao Damaraju, San Francisco, CA (US); Zoran Stefanoski, San Francisco, CA (US)

(73) Assignee: GM CRUISE HOLDINGS LLC, San Francisco, CA (US)

( * ) Notice: Subject to any disclaimer, the term of this patent is extended or adjusted under 35 U.S.C. 154(b) by 199 days.

(21) Appl. No.: 17/307,696

(22) Filed: May 4, 2021

(65) Prior Publication Data
US 2022/0361316 A1 Nov. 10, 2022

(51) Int. Cl.
*H05K 1/02* (2006.01)
*H05K 7/20* (2006.01)
*H05K 1/18* (2006.01)

(52) U.S. Cl.
CPC ........... *H05K 1/0203* (2013.01); *H05K 1/181* (2013.01); *H05K 7/2039* (2013.01); *H05K 2201/066* (2013.01)

(58) Field of Classification Search
CPC ........... H05K 7/20254; H05K 7/20854; H05K 7/20872; H05K 7/20272; H05K 1/181
See application file for complete search history.

(56) References Cited

U.S. PATENT DOCUMENTS

| | | | | |
|---|---|---|---|---|
| 2009/0004500 | A1* | 1/2009 | Suh | B23K 35/001 29/469 |
| 2009/0117373 | A1* | 5/2009 | Wisniewski | H01L 23/3735 427/190 |

(Continued)

OTHER PUBLICATIONS

"MR315 Urethane & Styrene Silicone Release Agent", Internet Archive, Wayback Machine, Aug. 14, 2020, Retrieved at: <<https://web.archive.org/web/20200814165102/https://www.sprayon.com/product/mr315-urethane-styrene-silicone-release-agent/>>, 4 pages.

*Primary Examiner* — Adam B Dravininkas
(74) *Attorney, Agent, or Firm* — CALFEE, HALTER & GRISWOLD LLP

(57) ABSTRACT

Various technologies described herein pertain to an autonomous vehicle computing device for an autonomous vehicle. The autonomous vehicle computing device includes a printed circuit board, a heat sink, and a thermal interface material layer between the printed circuit board and the heat sink. The autonomous vehicle computing device further includes a barrier layer between the thermal interface material layer and the printed circuit board. The thermal interface material layer can be formed of a two-part thermal interface material that cures in place. The barrier layer between the thermal interface material layer and the printed circuit board enables separation of the printed circuit board from the thermal interface material layer if reworking or modification of the autonomous vehicle computing device is desired. The barrier layer can enable the printed circuit board to be separated from the thermal interface material layer in a manner that mitigates damage to the printed circuit board.

20 Claims, 8 Drawing Sheets

(56) References Cited

U.S. PATENT DOCUMENTS

| | | | |
|---|---|---|---|
| 2015/0334871 A1* | 11/2015 | Hill | B32B 27/34 |
| | | | 156/247 |
| 2019/0031034 A1* | 1/2019 | Young | B60L 50/51 |
| 2019/0181069 A1* | 6/2019 | Rykaczewski | B32B 27/283 |
| 2019/0373768 A1* | 12/2019 | Papoulis | H05K 7/20254 |
| 2019/0394898 A1* | 12/2019 | Manninen | H05K 7/209 |

\* cited by examiner

AUTONOMOUS VEHICLE COMPUTING DEVICE WITH BARRIER LAYER

BACKGROUND

An autonomous vehicle is a motorized vehicle that can operate without human conduction. An exemplary autonomous vehicle can include a plurality of sensor systems such as, but not limited to, a lidar sensor system, a camera sensor system, and a radar sensor system, amongst others. Accordingly, the autonomous vehicle can operate based upon sensor signals outputted by the sensor systems.

The autonomous vehicle can also include one or more autonomous vehicle computing devices. An autonomous vehicle computing device can control various vehicle functions. Examples of vehicle functions that can be controlled by the autonomous vehicle computing device include driving control (e.g., propulsion, steering, braking, etc.), localization of the autonomous vehicle (e.g., determining a local position of the autonomous vehicle), perception of objects nearby the autonomous vehicle (e.g., detecting, classifying, and predicting behavior of the objects nearby the autonomous vehicle), a combination thereof, and so forth. According to an illustration, sensor signals from a sensor system can be inputted to an autonomous vehicle computing device. Moreover, pursuant to another illustration, a sensor system can include an autonomous vehicle computing device.

An autonomous vehicle computing device oftentimes includes a printed circuit board, a heat sink, and a thermal interface material layer between the printed circuit board and the heat sink. The thermal interface material layer can fill a gap that would otherwise exist between the printed circuit board and the heat sink. The thermal interface material layer oftentimes cures in place subsequent to the autonomous vehicle computing device being assembled. Once the thermal interface material layer cures, it bonds to the printed circuit board and the heat sink.

Due to the bond of the thermal interface material layer to the printed circuit board and the heat sink subsequent to curing, it may be difficult to rework or reposition the printed circuit board with respect to the heat sink without damaging the printed circuit board (e.g., the printed circuit board itself and/or component(s) on the printed circuit board) and/or the heat sink. Accordingly, with conventional approaches, the printed circuit board (e.g., the printed circuit board itself and/or component(s) on the printed circuit board) and/or the heat sink may be damaged should the printed circuit board need to be separated from the heat sink for reworking or adjustment after curing of the thermal interface material layer. Thus, conventional approaches can result in being unable to reuse printed circuit boards and/or heat sinks once the thermal interface material layer has cured if adjustment or modification needs to be made to the autonomous vehicle computing device.

SUMMARY

The following is a brief summary of subject matter that is described in greater detail herein. This summary is not intended to be limiting as to the scope of the claims.

Described herein are various technologies that pertain to an autonomous vehicle computing device for an autonomous vehicle. The autonomous vehicle computing device includes a printed circuit board and a heat sink. Moreover, the autonomous vehicle computing device includes a thermal interface material layer between the printed circuit board and the heat sink. The autonomous vehicle computing device further includes a barrier layer between the thermal interface material layer and the printed circuit board. The thermal interface material layer can be formed of a two-part thermal interface material that cures in place. The barrier layer between the thermal interface material layer and the printed circuit board can enable separation of the printed circuit board from the thermal interface material layer should reworking or modification of the autonomous vehicle computing device need to occur (e.g., adjustment of a position or orientation of the printed circuit board relative to the heat sink). Thus, the barrier layer can enable the printed circuit board to be separated from the thermal interface material layer in a manner that mitigates damage to the printed circuit board.

According to various embodiments, the autonomous vehicle computing device can further include a second barrier layer between the thermal interface material layer and the heat sink. Similar to above, the second barrier layer can enable the heat sink to be separated from the thermal interface material layer without the thermal interface material layer damaging the heat sink. In other embodiments, the autonomous vehicle computing device can lack a barrier layer between the thermal interface material layer and the heat sink.

Various types of barrier layer are intended to fall within the scope of the hereto appended claims. For example, a barrier layer may be formed of a solid material. Following this example, the barrier layer may be formed of aluminum foil, copper foil, or the like. According to other examples, the barrier layer may be formed of a coating. For instance, the barrier layer can be formed of a polytetrafluoroethylene based coating, a silicone based coating, a graphite based coating, an oil based coating, or the like. Pursuant to an illustration, the barrier layer may be formed of a urethane styrene silicone based coating. A coating, for example, can be on the printed circuit board (e.g., a coating on component(s) on the printed circuit board and the printed circuit board itself), on the heat sink, and so forth.

A barrier layer can enable separation from a thermal interface material layer. Thus, the barrier layer between the thermal interface material layer and the printed circuit board can allow the printed circuit board to be separated from the thermal interface material layer. Similarly, the second barrier layer between the thermal interface material layer and the heat sink can allow the heat sink to be separated from the thermal interface material layer. Other properties of the barrier layer can include minimal impact on thermal performance (e.g., minimal impact on dissipation of heat from the printed circuit board or component(s) on the printed circuit board to the heat sink) and minimal chemical impact (e.g., the barrier layer does not chemically interact with the thermal interface material layer, the printed circuit board or component(s) on the printed circuit board, the heat sink, etc. in a manner that degrades or changes properties of the thermal interface material layer, the printed circuit board or component(s) on the printed circuit board, the heat sink, etc. and vice versa).

The thermal interface material layer can be formed of a two-part thermal interface material that cures in place. After the two-part thermal interface material cures, the thermal interface material layer may be sticky; thus, it may be difficult to separate a printed circuit board, heat sink, or the like from the thermal interface material layer after curing if a barrier layer as described herein were not included in the autonomous vehicle computing device. Accordingly, inclusion of the barrier layer and/or the second barrier layer enables the printed circuit board and/or the heat sink to be repositioned by being separated from the thermal interface material layer without damage being caused by the material of the thermal interface material layer.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
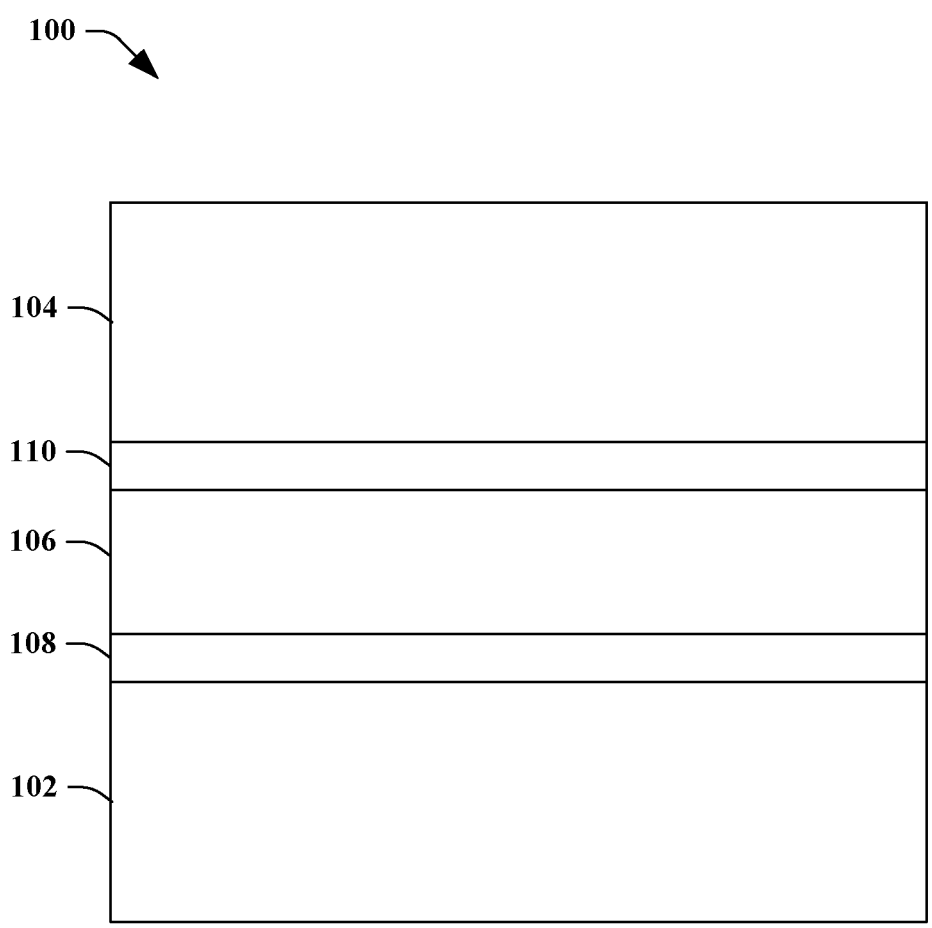
FIG. 1 illustrates a side view of a portion of an exemplary autonomous vehicle computing device for an autonomous vehicle.

Various technologies pertaining to an autonomous vehicle computing device that includes a barrier layer are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

As used herein, the terms "component" and "system" are intended to encompass computer-readable data storage that is configured with computer-executable instructions that cause certain functionality to be performed when executed by a processor. The computer-executable instructions may include a routine, a function, or the like. It is also to be understood that a component or system may be localized on a single device or distributed across several devices. Further, as used herein, the term "exemplary" is intended to mean "serving as an illustration or example of something."

As described herein, one aspect of the present technology is the gathering and use of data available from various sources to improve quality and experience. The present disclosure contemplates that in some instances, this gathered data may include personal information. The present disclosure contemplates that the entities involved with such personal information respect and value privacy policies and practices.

Turning now to the drawings, FIG. 1 illustrates a side view of a portion of an exemplary autonomous vehicle computing device 100 for an autonomous vehicle. The autonomous vehicle computing device 100 can be configured for use in an autonomous vehicle. Thus, the autonomous vehicle computing device 100 can be attachable to the autonomous vehicle, included in the autonomous vehicle, etc.

The autonomous vehicle computing device 100 can control various functions of the autonomous vehicle. For example, functions that can be controlled by the autonomous vehicle computing device 100 can include driving control (e.g., controlling propulsion, steering, braking, etc.) of the autonomous vehicle, localization of the autonomous vehicle (e.g., determining a local position of the autonomous vehicle), perception of objects nearby the autonomous vehicle (e.g., detecting, classifying, and predicting behavior of the objects nearby the autonomous vehicle), a combination thereof, and so forth. According to an illustration, the autonomous vehicle computing device 100 can be coupled to one or more sensor systems of the autonomous vehicle; thus, the autonomous vehicle computing device 100 can receive sensor signals from the one or more sensor systems. Pursuant to another illustration, a sensor system of the autonomous vehicle can include the autonomous vehicle computing device 100. Following this illustration, the autonomous vehicle computing device 100 can be a sensor in a sensor system of the autonomous vehicle, for instance. Examples of such a sensor include a radar sensor, a lidar sensor, a camera sensor, a hybrid sensor, or the like. A hybrid sensor, for instance, can combine sensing modalities (e.g., a hybrid sensor can be a combination of two or more of a lidar sensor, a camera sensor, and a radar sensor).

The autonomous vehicle computing device 100 includes a printed circuit board 102 and a heat sink 104. Although not shown in FIG. 1, it is to be appreciated that the printed circuit board 102 can include various components of the autonomous vehicle computing device 100. The components can be mounted on, integrated into, formed on, etc. the printed circuit board 102 (referred to herein as "a component being on a printed circuit board"). Examples of the components include central processing unit(s) (CPU(s)), graphics processing unit(s) (GPU(s)), switch(es), field-programmable gate array(s) (FPGA(s)), or the like. The printed circuit board 102 can include substantially any number and/or types of components. Moreover, the heat sink 104 can be a coldplate, a heat spreader, a cover of the autonomous vehicle computing device 100, or the like.

The autonomous vehicle computing device 100 includes a thermal interface material layer 106 between the printed circuit board 102 and the heat sink 104. The thermal interface material layer 106 can be utilized to fill an air gap between the printed circuit board 102 and the heat sink 104.

The thermal interface material layer 106 can be formed of a two-part thermal interface material that cures in place.

Further, the autonomous vehicle computing device 100 includes a barrier layer 108 between the thermal interface material layer 106 and the printed circuit board 102 (e.g., a first barrier layer). As shown in the example of FIG. 1, the barrier layer 108 can abut the printed circuit board 102 and the thermal interface material layer 106; however, it is contemplated that other layer(s) or gap(s) can be between the barrier layer 108 and the printed circuit board 102 and/or between the barrier layer 108 and the thermal interface material layer 106 (in at least a portion of the autonomous vehicle computing device 100). The barrier layer 108 can enable the printed circuit board 102 to be separated from the thermal interface material layer 106 after the thermal interface material layer 106 cures while mitigating damage to the printed circuit board 102 (and/or component(s) on the printed circuit board 102). In contrast, without a barrier layer between the printed circuit board 102 and the thermal interface material layer 106, it may be difficult to separate the printed circuit board 102 from the thermal interface material layer 106 without damage to the printed circuit board 102. Thus, the barrier layer 108 enables the printed circuit board 102 to be separated from thermal interface material layer 106 by applying less force as compared to a force for separating a printed circuit board from a thermal interface material layer of a conventional autonomous vehicle computing device that lacks a barrier layer such as the barrier layer 108.

In the example depicted in FIG. 1, the autonomous vehicle computing device 100 also includes a barrier layer 110 between the thermal interface material layer 106 and the heat sink 104 (e.g., a second barrier layer). The barrier layer 110 can abut the heat sink 104 and the thermal interface material. Similar to above, it is to be appreciated that other layer(s) or gap(s) can be between the barrier layer 110 and the heat sink 104 and/or between the barrier layer 110 and the thermal interface material layer 106 (in at least a portion of the autonomous vehicle computing device 100). Further, similar to above, the barrier layer 110 can enable the heat sink 104 to be separated from the thermal interface material layer 106 after the thermal interface material layer 106 cures.

The barrier layers 108-110 can be formed of various types of materials (solids or liquids can be utilized as the barrier layers 108-110). Below are various examples pertaining to the barrier layer 108; it is to be appreciated that the barrier layer 110 (or any other barrier layer) can be substantially similar to the barrier layer 108 described below.

The barrier layer 108, for example, may be formed of a solid material. Following this example, the barrier layer 108 may be formed of aluminum foil, copper foil, or the like. The solid material can be located between the thermal interface material layer 106 and the printed circuit board 102.

According to another example, the barrier layer 108 may be formed of a coating. The coating may be a hydrophobic coating; yet, the claimed subject matter is not so limited. The barrier layer 108, for instance, can be formed of a polytetrafluoroethylene based coating, a silicone based coating, a graphite based coating, an oil based coating, or the like. Pursuant to an illustration, the barrier layer 108 may be formed of a urethane styrene silicone based coating. The coating that forms the barrier layer 108 can be on the printed circuit board 102 (e.g., a coating on component(s) on the printed circuit board 102 and/or the printed circuit board 102 itself). The coating, for instance, can be a release agent. According to an example, the coating can be a liquid that can be applied to the printed circuit board 102 (e.g., the coating can be sprayed, brushed, or otherwise applied to the printed circuit board 102).

Pursuant to an illustration, the barrier layer 108 and the barrier layer 110 can be formed of the same type of material. In accordance with another illustration, the barrier layer 108 and the barrier layer 110 can be formed of differing types of materials.

Heat can flow from the printed circuit board 102 (e.g., from component(s) on the printed circuit board 102) to the heat sink 104. The heat can pass through the barrier layer 108, the thermal interface material layer 106, and the barrier layer 110. A property of the barrier layers 108-110 is that the barrier layers 108-110 can have minimal impact of thermal performance of the autonomous vehicle computing device 100 (e.g., minimal impact on dissipation of heat from the printed circuit board 102 or component(s) on the printed circuit board 102 to the heat sink 104). For example, thermal performance can be within +/−1 degree Celsius when compared to a similar autonomous vehicle computing device that lacks barrier layers (e.g., comparing a temperature difference across the barrier layer 108, the thermal interface material layer 106, and the barrier layer 110 of the autonomous vehicle computing device 100 to a temperature difference across a thermal interface material layer of a conventional autonomous vehicle computing device that lacks barrier layers). For instance, if the barrier layers 108-110 are formed of a urethane styrene silicone based coating, then the temperature difference across the barrier layer 108, the thermal interface material layer 106, and the barrier layer 110 may be 2.3 degrees Celsius. In comparison, a conventional autonomous vehicle computing device that lacks such barrier layers may provide a temperature difference of 2.4 degrees Celsius across a similar thermal interface material layer.

Moreover, another property of the barrier layers 108-110 is that the barrier layers 108-110 can have minimal chemical impact. For instance, the barrier layer 108 does not chemically interact with the thermal interface material layer 106 or the printed circuit board 102 (or component(s) on the printed circuit board 102) in a manner that degrades or detrimentally changes properties of the thermal interface material layer 106 or the printed circuit board 102 (or component(s) on the printed circuit board 102). Likewise, the thermal interface material layer 106 or the printed circuit board 102 (or component(s) on the printed circuit board 102) do not chemically interact with the barrier layer 108 in a manner that degrades or detrimentally changes properties of the barrier layer 108. Likewise, the barrier layer 110 similarly does not chemically interact with the thermal interface material layer 106 or the heat sink 104, or vice versa.

Figure 2:
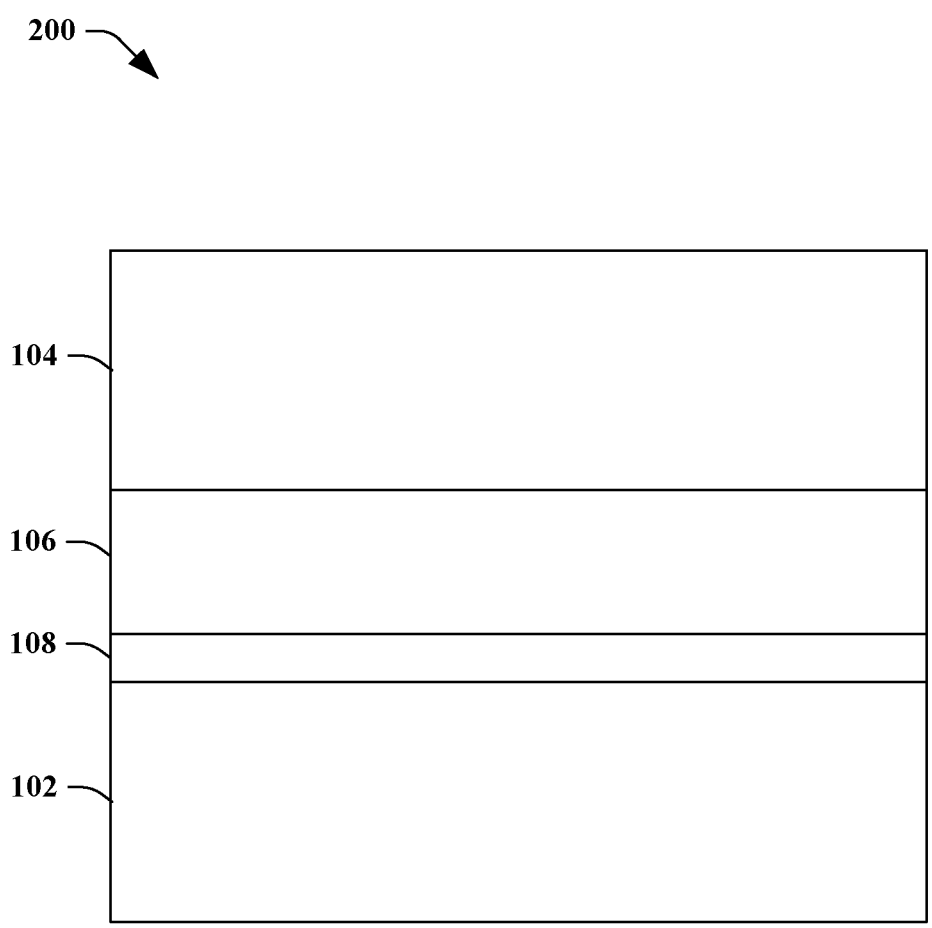
FIG. 2 illustrates a side view of a portion of another exemplary autonomous vehicle computing device.

Now turning to FIG. 2, illustrated is a side view of a portion of another exemplary autonomous vehicle computing device 200. Similar to above, the autonomous vehicle computing device 200 includes the printed circuit board 102, the heat sink 104, and the thermal interface material layer 106 there between. In the example depicted in FIG. 2, the autonomous vehicle computing device 200 can include the barrier layer 108 between the thermal interface material layer 106 and the printed circuit board 102. Yet, in the example shown in FIG. 2, the autonomous vehicle computing device 200 lacks a barrier layer between the thermal interface material layer 106 and the heat sink 104 (e.g., the autonomous vehicle computing device 200 lacks the barrier layer 110 of the autonomous vehicle computing device 100 of FIG. 1).

As depicted in FIG. 2, the thermal interface material layer 106 can abut the heat sink 104 (e.g., the thermal interface material layer 106 can be adjacent to the heat sink 104 without a layer there between). Yet, it is contemplated that layer(s) or gap(s) can be between the thermal interface material layer 106 and the heat sink 104 (in at least a portion of the autonomous vehicle computing device 200.

Figure 3:
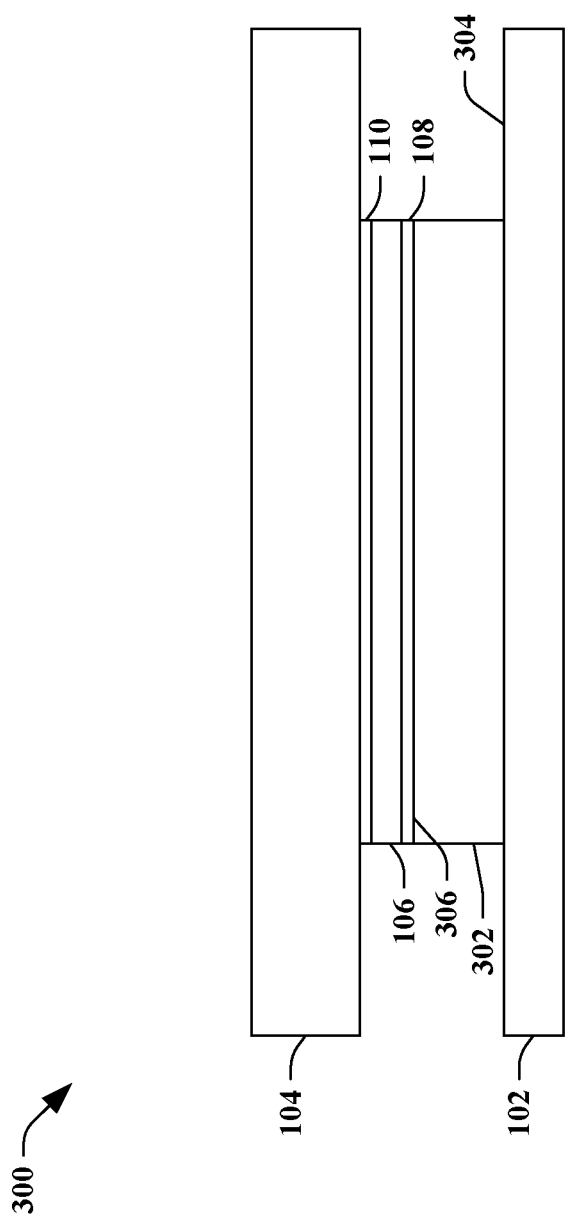
FIG. 3 illustrates a side view of a portion of a further exemplary autonomous vehicle computing device.

With reference to FIG. 3, illustrated is a side view of a portion of an exemplary autonomous vehicle computing device 300. The autonomous vehicle computing device 300 includes the printed circuit board 102, the heat sink 104, and the thermal interface material layer 106 between the printed circuit board 102 and the heat sink 104. In the example shown in FIG. 3, the printed circuit board 102 includes a component 302. More particularly, the component 302 is surface mounted on a top side 304 of the printed circuit board 102 in the illustrated example. The component 302, for example, can be a CPU, a GPU, a switch, an FPGA, or the like.

The autonomous vehicle computing device 300 depicted in FIG. 3 further includes the barrier layer 108 and the barrier layer 110. The barrier layer 108 is between the thermal interface material layer 106 and the component 302 mounted on the printed circuit board 102. As shown, the barrier layer 108 abuts a top surface 306 of the component 302 mounted on the printed circuit board 102. Further, similar to the autonomous vehicle computing device 100 of FIG. 1, the barrier layer 110 is between the thermal interface material layer 106 and the heat sink 104; yet, it is contemplated that the claimed subject matter is not so limited (e.g., the autonomous vehicle 300 can alternatively lack the barrier layer 110 between the thermal interface material layer 106 and the heat sink 104).

During operation of the autonomous vehicle computing device 300, the component 302 can generate heat. The heat from the top surface 306 of the component 302 can pass through the barrier layer 108, the thermal interface material layer 106, and the barrier layer 110 to the heat sink 104.

It is to be appreciated that the printed circuit board 102 can include substantially any number and/or type(s) of components (e.g., surface mounted on the printed circuit board 102, integrated into the printed circuit board 102, formed on the printed circuit board 102, a combination thereof, etc.). The barrier layers 108-110 as well as the thermal interface material layer 106 can likewise be between the other component(s) on the printed circuit board 102 and the heat sink 104 (or between a subset of the other component(s) on the printed circuit board 102 and the heat sink 104).

Figure 4:
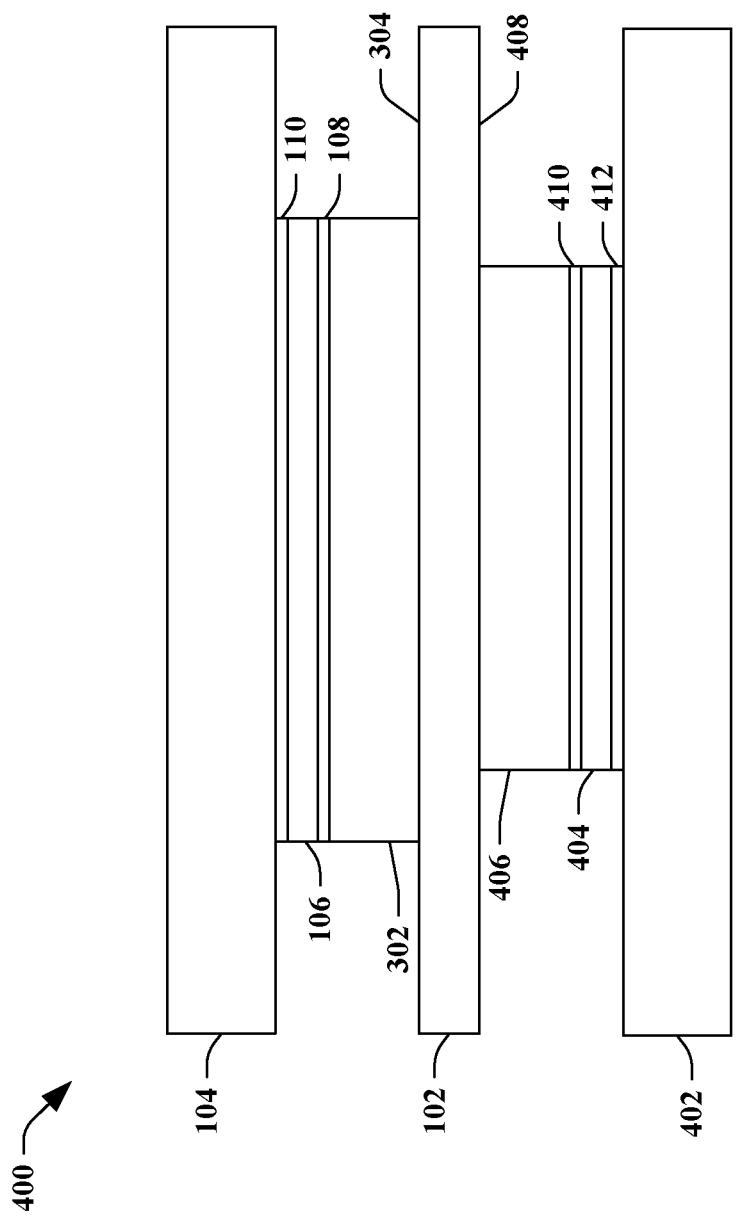
FIG. 4 illustrates a side view of a portion of another exemplary autonomous vehicle computing device.

With reference to FIG. 4, illustrated is a side view of a portion of another exemplary autonomous vehicle computing device 400. The autonomous vehicle computing device 400 includes the printed circuit board 102, the heat sink 104, and the thermal interface material layer 106 between the printed circuit board 102 and the heat sink 104. The autonomous vehicle component device 400 further includes a second heat sink 402 and a second thermal interface material layer 404 between the printed circuit board 102 and the second heat sink 402.

Similar to FIG. 3, the printed circuit board 102 of the autonomous vehicle computing device 400 shown in FIG. 4 includes the component 302 surface mounted on the top side 304 of the printed circuit board 102. Again, the barrier layer 108 is between the thermal interface material layer 106 and the component 302 mounted on the top side 304 of the printed circuit board 102. Further, the barrier layer 110 is between the thermal interface material layer 106 and the heat sink 104; yet, again, it is to be appreciated that the claimed subject matter is not so limited.

Moreover, the printed circuit board 102 of the autonomous vehicle computing device 400 includes a component 406 surface mounted on a bottom side 408 of the printed circuit board 102. Additionally, the autonomous vehicle computing device 400 can include a barrier layer 410 between the thermal interface material layer 404 and the component 406. Further, the autonomous vehicle computing device 400 can include a barrier layer 412 between the thermal interface material layer 404 and the heat sink 402. During operation, the component 406 can generate heat, which can pass through the barrier layer 410, the thermal interface material layer 404, and the barrier layer 412 to the heat sink 402.

Figure 5:
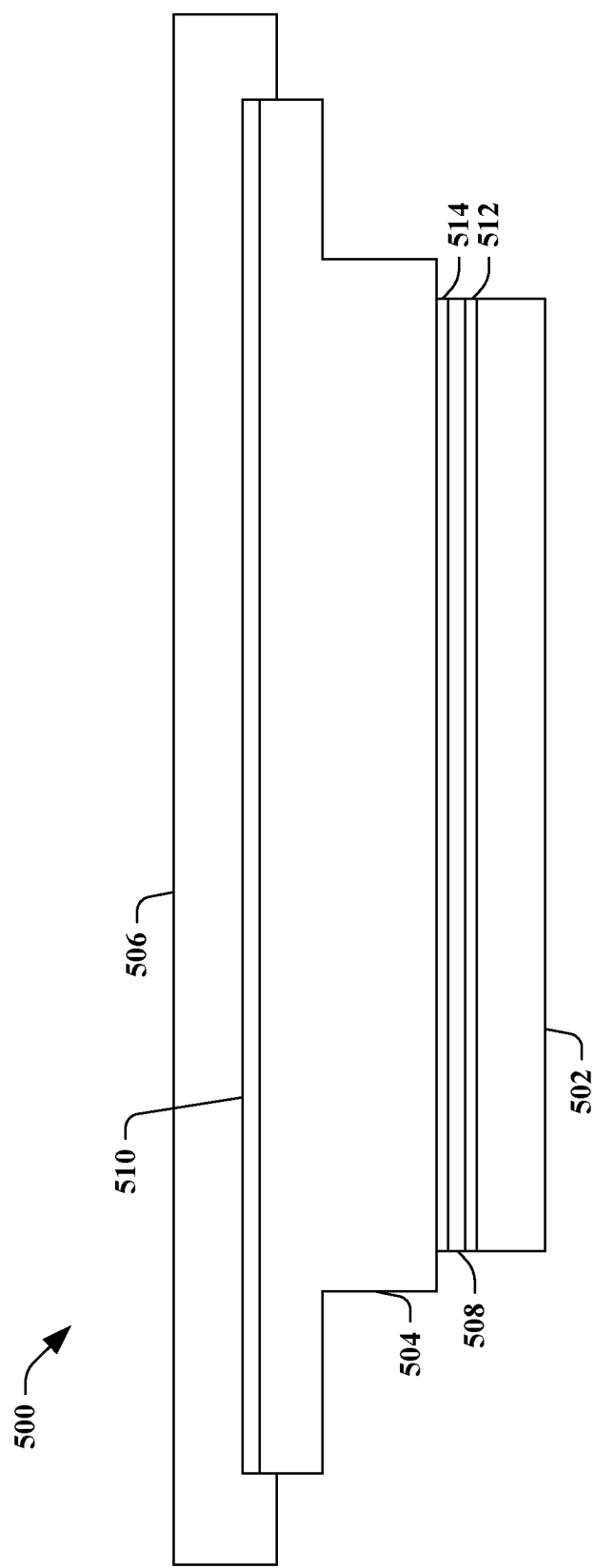
FIG. 5 illustrates a side view of a portion of yet another exemplary autonomous vehicle computing device.

With reference to FIG. 5, illustrated is a side view of a portion of yet another exemplary autonomous vehicle computing device 500. As shown in FIG. 5, the autonomous vehicle computing device 500 includes a lid 502 of a component (e.g., a component on a printed circuit board). Moreover, the autonomous vehicle computing device 500 includes a heat spreader 504 and a heat sink 506. Further, a first thermal interface material layer 508 is between the heat spreader 504 and the lid 502 of the component. Moreover, a second thermal interface material layer 510 is between the heat spreader 504 and the heat sink 506.

The heat spreader 504 can be a pedestal positioned on top of the lid 502 of the component. The heat spreader 504 can be employed due to differences in mechanical clearances of differing components on a printed circuit board. For instance, larger mechanical clearances can exist between a top of a GPU lid as compared to tops of other components on the printed circuit board. Thus, the heat spreader 504 as well as the first thermal interface material layer 508 and the second thermal interface material 510 can be positioned between the lid 502 and the heat sink 506 to fill a gap that would otherwise exist there between since other components on the same printed circuit board may be taller, and thus, a similar gap would not exist between the other components and the heat sink 506.

The autonomous vehicle computing device 500 further includes a barrier layer 512 between the lid 502 of the component and the first thermal interface material layer 508. The autonomous vehicle computing device 500 can also include a barrier layer 514 between the first thermal interface material layer 508 and the heat spreader 504; yet, the claimed subject matter is not so limited. Although not shown in FIG. 5, it is also contemplated that the autonomous vehicle computing device 500 can include a barrier layer between the heat spreader 504 and the second thermal interface material layer 510 and/or a barrier layer between the second thermal interface material layer 510 and the heat sink 506.

Figure 6:
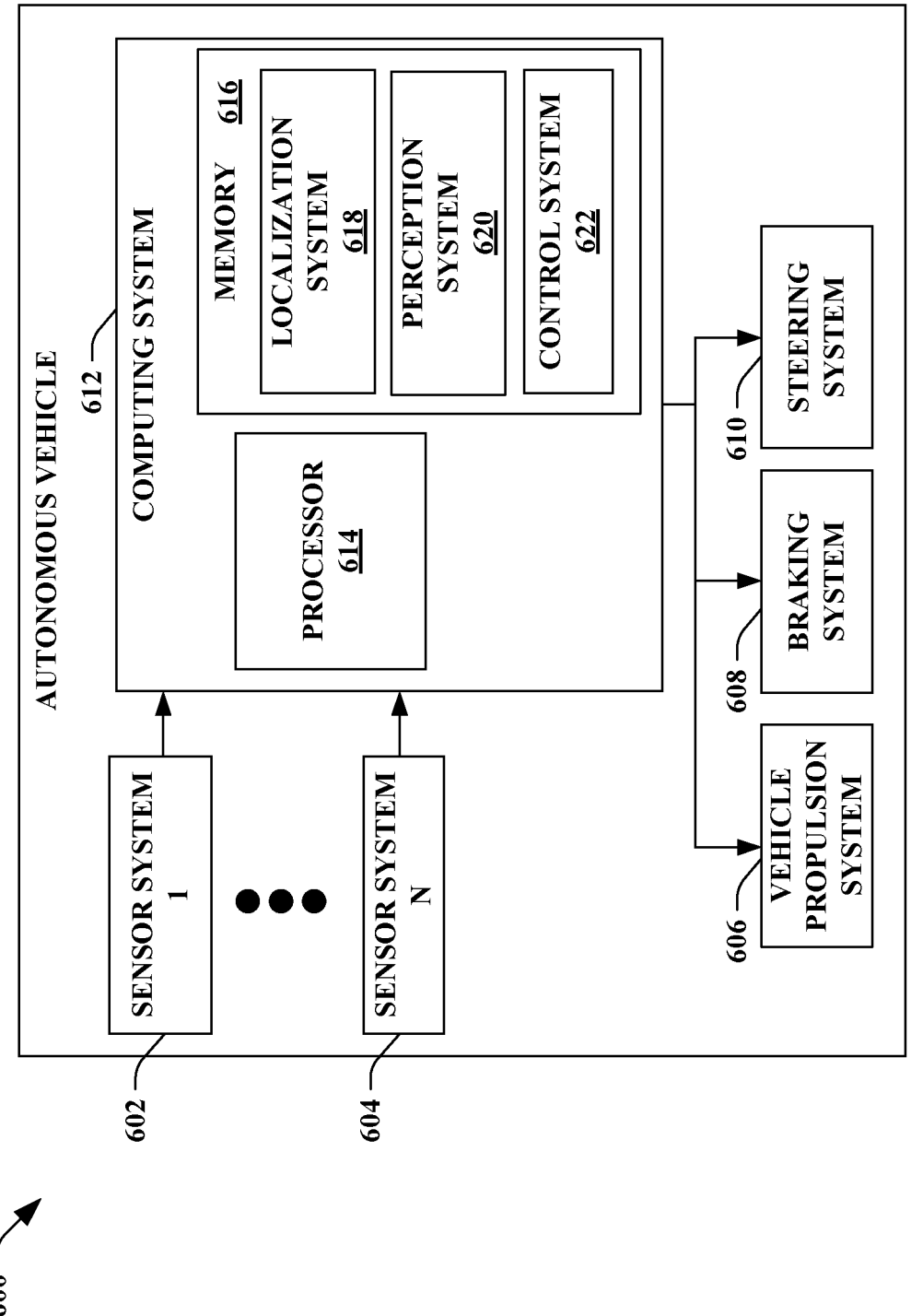
FIG. 6 illustrates a block diagram of an exemplary autonomous vehicle.

Turning to FIG. 6, illustrates an autonomous vehicle 600. The autonomous vehicle 600 can navigate about roadways without human conduction based upon sensor signals outputted by sensor systems of the autonomous vehicle 600. The autonomous vehicle 600 includes a plurality of sensor systems, namely, a sensor system 1 602, . . . , and a sensor system N 604, where N can be substantially any integer greater than 1 (collectively referred to herein as sensor systems 602-604). The sensor systems 602-604 are of different types and are arranged about the autonomous vehicle 600. For example, the sensor system 1 602 may be a lidar sensor system and the sensor system N 604 may be a camera (image) system. Other exemplary sensor systems included in the sensor systems 602-604 can include radar sensor systems, GPS sensor systems, sonar sensor systems, infrared sensor systems, and the like.

The autonomous vehicle 600 further includes several mechanical systems that are used to effectuate appropriate motion of the autonomous vehicle 600. For instance, the mechanical systems can include, but are not limited to, a vehicle propulsion system 606, a braking system 608, and a steering system 610. The vehicle propulsion system 606 may be an electric engine or a combustion engine. The braking system 608 can include an engine brake, brake pads, actuators, and/or any other suitable componentry that is configured to assist in decelerating the autonomous vehicle 600. The steering system 610 includes suitable componentry that is configured to control the direction of movement of the autonomous vehicle 600.

The autonomous vehicle 600 additionally includes a computing system 614 that is in communication with the sensor systems 602-604, the vehicle propulsion system 606, the braking system 608, and the steering system 610. The computing system 612 includes a processor 614 and memory 616; the memory 616 includes computer-executable instructions that are executed by the processor 614. Pursuant to various examples, the processor 614 can be or include a graphics processing unit (GPU), a plurality of GPUs, a central processing unit (CPU), a plurality of CPUs, an application-specific integrated circuit (ASIC), a microcontroller, a programmable logic controller (PLC), a field programmable gate array (FPGA), or the like.

The memory 616 of the computing system 612 can include a localization system 618, a perception system 620, and a control system 622. The localization system 618 can be configured to determine a local position of the autonomous vehicle 600. The perception system 620 can be configured to perceive objects nearby the autonomous vehicle 600 (e.g., based on outputs from the sensor systems 602-604). For instance, the perception system 620 can detect, classify, and predict behaviors of objects nearby the autonomous vehicle 600. Moreover, the control system 622 can be configured to control at least one of the mechanical systems of the autonomous vehicle 600 (e.g., at least one of the vehicle propulsion system 606, the braking system 608, and/or the steering system 610).

According to various examples, the computing system 612 can be or include an autonomous vehicle computing device (e.g., the autonomous vehicle computing device 100, 200, 300, 400, or 500). Pursuant to other examples, a sensor system (e.g., the sensor system 1 602, . . . , or the sensor system N 604) can include an autonomous vehicle computing device (e.g., the autonomous vehicle computing device 100, 200, 300, 400, or 500).

Figure 7:
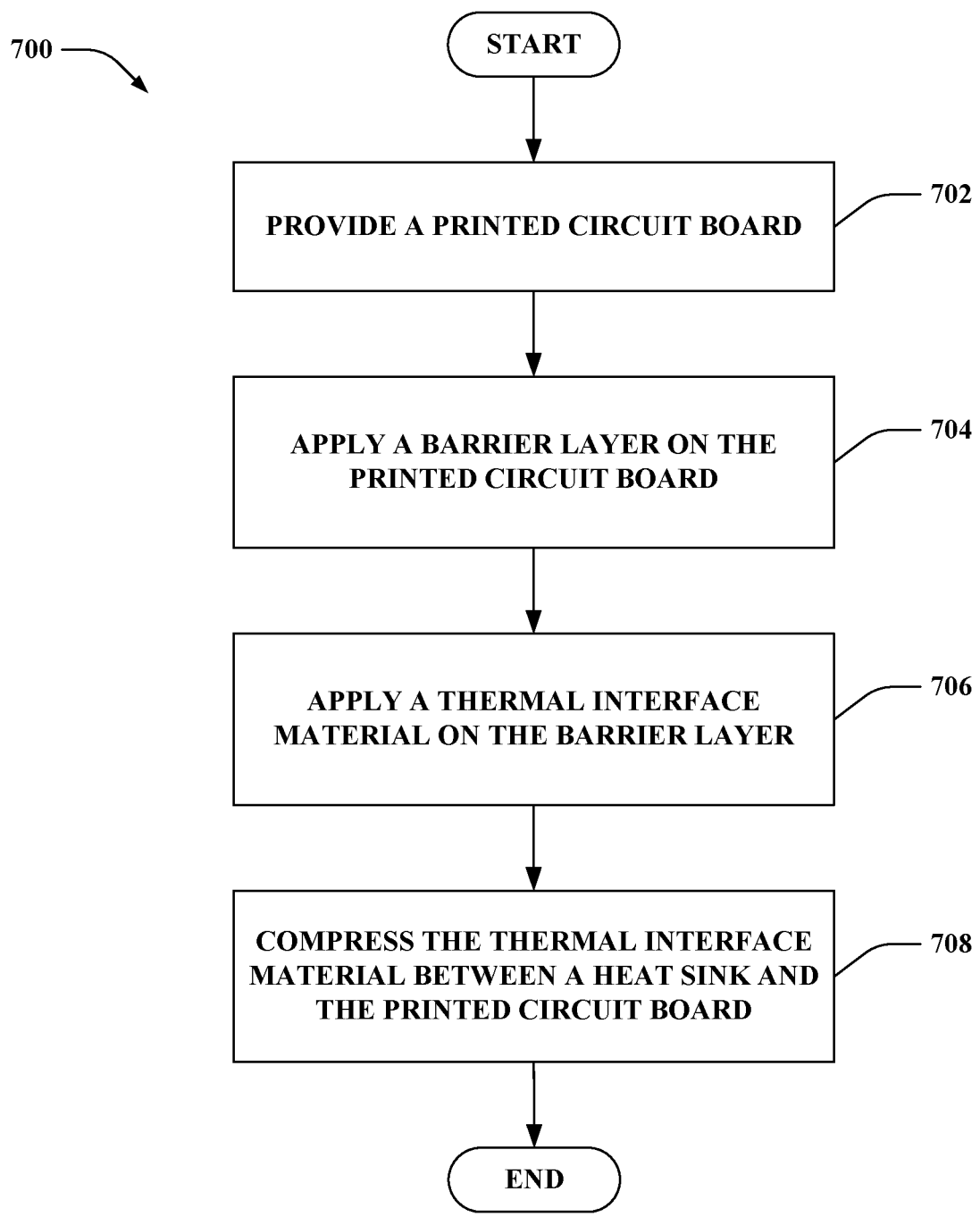
FIG. 7 is a flow diagram that illustrates an exemplary methodology of assembling an autonomous vehicle computing device.

FIG. 7 illustrates an exemplary methodology relating to assembling an autonomous vehicle computing device. While the methodology is shown and described as being a series of acts that are performed in a sequence, it is to be understood and appreciated that the methodology is not limited by the order of the sequence. For example, some acts can occur in a different order than what is described herein. In addition, an act can occur concurrently with another act. Further, in some instances, not all acts may be required to implement a methodology described herein.

FIG. 7 illustrates a methodology 700 of assembling an autonomous vehicle computing device. At 702, a printed circuit board can be provided. As described herein, the printed circuit board can include various components (e.g., one or more components can be on the printed circuit board). At 704, a barrier layer can be applied on the printed circuit board. The barrier layer can be applied on the printed circuit board by applying a coating on the printed circuit board, for example. Examples of the coating include a polytetrafluoroethylene based coating, a silicone based coating, a graphite based coating, or an oil based coating. Pursuant to an illustration, the coating can be a urethane styrene silicone based coating. According to another example, the barrier layer can be applied on the printed circuit board by positioning a solid material on the printed circuit board. At 706, a thermal interface material can be applied on the barrier layer. The thermal interface material can be a two part thermal interface material that cures in place. At 708, the thermal interface material can be compressed between a heat sink and the printed circuit board. Thus, the thermal interface material can cure to form a thermal interface material layer. Moreover, the barrier layer can be between the printed circuit board and the thermal interface material layer formed from the thermal interface material.

According to various embodiments, a second barrier layer can be applied on the heat sink. Thereafter, the thermal interface material can be compressed between the heat sink and the printed circuit board, such that the barrier layer is between the printed circuit board and the thermal interface material layer formed from the thermal interface material and the second barrier layer is between the heat sink and the thermal interface material layer formed from the thermal interface material.

Further, the printed circuit board can be separated from the thermal interface material layer at the barrier layer subsequent to curing of the thermal interface material. Thus, the printed circuit board can be separated (e.g., for reworking or repositioning) without damaging the printed circuit board or component(s) on the printed circuit board.

Figure 8:
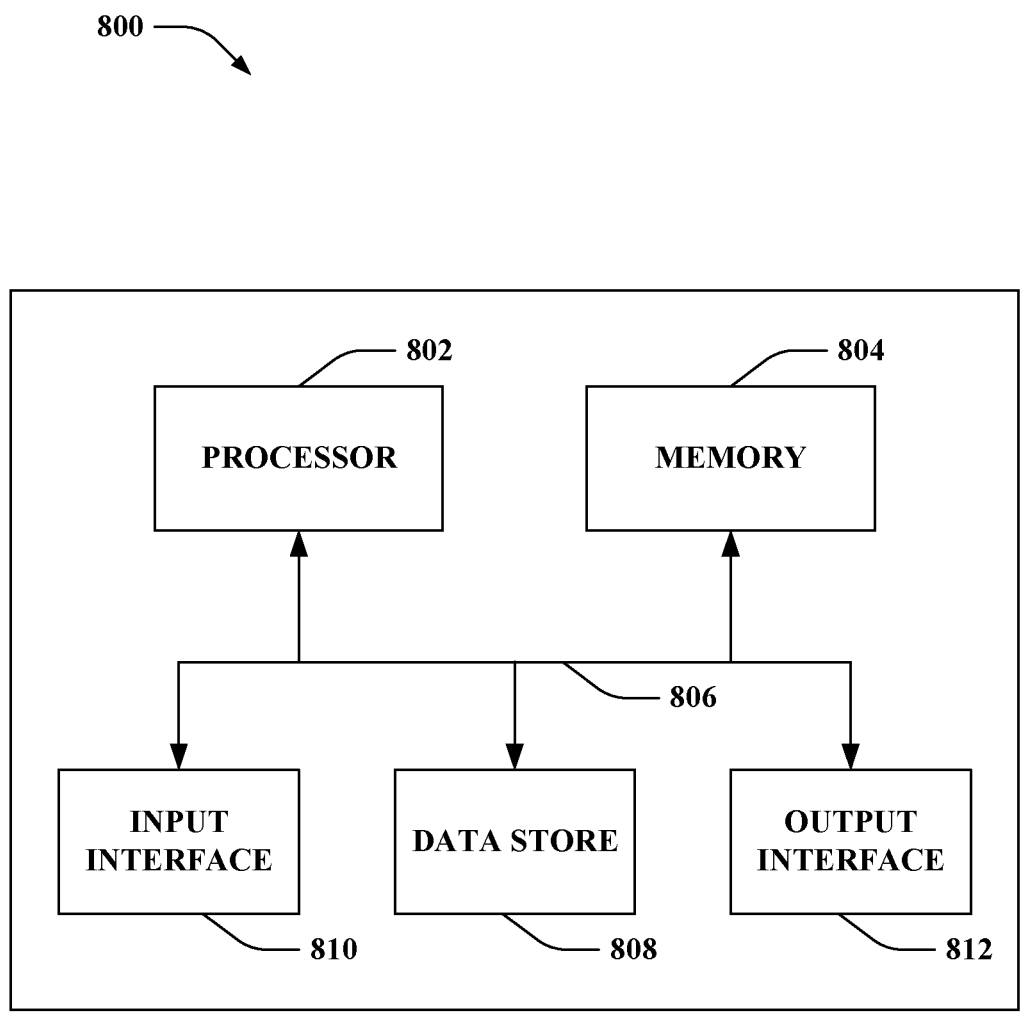
FIG. 8 illustrates an exemplary computing device.

Referring now to FIG. 8, a high-level illustration of an exemplary computing device 800 that can be used in accordance with the systems and methodologies disclosed herein is illustrated. For instance, the computing device 800 may be or include the computing system 612. The computing device 800 includes at least one processor 802 that executes instructions that are stored in a memory 804. The instructions may be, for instance, instructions for implementing functionality described as being carried out by one or more systems discussed above or instructions for implementing one or more of the methods described above. The processor 802 may be a GPU, a plurality of GPUs, a CPU, a plurality of CPUs, a multi-core processor, etc. The processor 802 may access the memory 804 by way of a system bus 806.

The computing device 800 additionally includes a data store 808 that is accessible by the processor 802 by way of the system bus 806. The data store 808 may include executable instructions, various data, etc. The computing device 800 also includes an input interface 810 that allows external devices to communicate with the computing device 800. For instance, the input interface 810 may be used to receive instructions from an external computer device, etc. The computing device 800 also includes an output interface 812 that interfaces the computing device 800 with one or more external devices. For example, the computing device 800 may transmit control signals to the vehicle propulsion system 606, the braking system 608, and/or the steering system 610 by way of the output interface 812.

Additionally, while illustrated as a single system, it is to be understood that the computing device 800 may be a distributed system. Thus, for instance, several devices may be in communication by way of a network connection and may collectively perform tasks described as being performed by the computing device 800.

Various functions described herein can be implemented in hardware, software, or any combination thereof. If implemented in software, the functions can be stored on or transmitted over as one or more instructions or code on a computer-readable medium. Computer-readable media includes computer-readable storage media. A computer-readable storage media can be any available storage media that can be accessed by a computer. By way of example, and not limitation, such computer-readable storage media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer. Disk and disc, as used herein, include compact disc (CD), laser disc, optical disc, digital versatile disc (DVD), floppy disk, and blu-ray disc (BD), where disks usually reproduce data magnetically and discs usually reproduce data optically with lasers. Further, a propagated signal is not included within the scope of computer-readable storage media. Computer-readable media also includes communication media including any medium that facilitates transfer of a computer program from one place to another. A connection, for instance, can be a communication medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio and microwave are included in the definition of communication medium. Combinations of the above should also be included within the scope of computer-readable media.

Alternatively, or in addition, the functionality described herein can be performed, at least in part, by one or more hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the scope of the appended claims. Furthermore, to the extent that the term "includes" is used in either the details description or the claims, such term is intended to be inclusive in a manner similar to the term "comprising" as "comprising" is interpreted when employed as a transitional word in a claim.

What is claimed is:

1. An autonomous vehicle computing device, comprising:
    a printed circuit board;
    a heat sink;
    a thermal interface material layer between the printed circuit board and the heat sink; and
    a barrier layer between the thermal interface material layer and the printed circuit board, wherein the thermal interface material layer and the printed circuit board are separatable at the barrier layer after curing of the thermal interface material layer.

2. The autonomous vehicle computing device of claim 1, further comprising:
    a second barrier layer between the thermal interface material layer and the heat sink, wherein the thermal interface material layer and the heat sink are separatable at the second barrier layer after curing of the thermal interface material layer.

3. The autonomous vehicle computing device of claim 1, the printed circuit board comprises a component, the component being surface mounted on the printed circuit board, and the barrier layer being between thermal interface material layer and the component mounted on the printed circuit board.

4. The autonomous vehicle computing device of claim 3, the component comprises at least one of a central processing unit (CPU), a graphics processing unit (GPU), a switch, or a field-programmable gate array (FPGA).

5. The autonomous vehicle computing device of claim 1, the heat sink comprises at least one of a coldplate, a heat spreader, or a cover of the autonomous vehicle computing device.

6. The autonomous vehicle computing device of claim 1, the thermal interface material layer being formed of a two part thermal interface material that cures in place.

7. The autonomous vehicle computing device of claim 1, the barrier layer being formed of a coating on the printed circuit board.

8. The autonomous vehicle computing device of claim 1, the barrier layer being formed of a solid material.

9. The autonomous vehicle computing device of claim 1, the barrier layer being formed of one of aluminum foil or copper foil.

10. The autonomous vehicle computing device of claim 1, the barrier layer being formed of one of a polytetrafluoroethylene based coating, a silicone based coating, a graphite based coating, or an oil based coating.

11. The autonomous vehicle computing device of claim 1, the barrier layer being formed of a urethane styrene silicone based coating.

12. A method of assembling an autonomous vehicle computing device, comprising:
    providing a printed circuit board;
    applying a barrier layer on the printed circuit board;
    applying a thermal interface material on the barrier layer; and
    compressing the thermal interface material between a heat sink and the printed circuit board, wherein the barrier layer is between the printed circuit board and a thermal interface material layer formed from the thermal interface material, and wherein the thermal interface material layer and the printed circuit board are separatable at the barrier layer after curing of the thermal interface material layer.

13. The method of claim 12, further comprising:
    applying a second barrier layer on the heat sink, wherein the second barrier layer is between the heat sink and the thermal interface material layer formed from the thermal interface material, and wherein the thermal interface material layer and the heat sink are separatable at the second barrier layer after curing of the thermal interface material layer.

14. The method of claim 12, wherein the thermal interface material is a two part thermal interface material that cures in place.

15. The method of claim 12, wherein applying the barrier layer on the printed circuit board comprises applying a coating on the printed circuit board.

16. The method of claim 15, the coating being one of a polytetrafluoroethylene based coating, a silicone based coating, a graphite based coating, or an oil based coating.

17. The method of claim 15, the coating being a urethane styrene silicone based coating.

18. The method of claim 12, wherein applying the barrier layer on the printed circuit board comprises positioning a solid material on the printed circuit board.

19. The method of claim 12, further comprising:
   separating the printed circuit board from the thermal interface material layer at the barrier layer subsequent to curing of the thermal interface material.

20. An autonomous vehicle, comprising:
   an autonomous vehicle computing device, comprising:
      a printed circuit board;
      a heat sink;
      a thermal interface material layer between the printed circuit board and the heat sink; and
      a barrier layer between the thermal interface material layer and the printed circuit board, wherein the thermal interface material layer and the printed circuit board are separatable at the barrier layer after curing of the thermal interface material layer.

* * * * *